(12) United States Patent
Adachi

(10) Patent No.: US 10,417,823 B2
(45) Date of Patent: Sep. 17, 2019

(54) COMPUTER PROGRAM PRODUCT, INFORMATION PROCESSING APPARATUS, AND DATA PROCESSING METHOD FOR GENERATING 3D SURFACE SHAPES

(71) Applicant: Kabushiki Kaisha Toshiba, Minato-ku (JP)

(72) Inventor: Mikio Adachi, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 156 days.

(21) Appl. No.: 15/548,113

(22) PCT Filed: Sep. 9, 2015

(86) PCT No.: PCT/JP2015/075650
§ 371 (c)(1),
(2) Date: Aug. 2, 2017

(87) PCT Pub. No.: WO2016/147441
PCT Pub. Date: Sep. 22, 2016

(65) Prior Publication Data
US 2018/0033197 A1    Feb. 1, 2018

(30) Foreign Application Priority Data

Mar. 18, 2015  (JP) .................................. 2015-055243

(51) Int. Cl.
*G06T 17/30* (2006.01)
*G06F 17/50* (2006.01)
(Continued)

(52) U.S. Cl.
CPC .............. *G06T 17/30* (2013.01); *B33Y 50/00* (2014.12); *G06F 17/50* (2013.01); *G06T 1/0007* (2013.01);
(Continued)

(58) Field of Classification Search
CPC .................................. G06T 17/30; G06T 17/50
See application file for complete search history.

(56) References Cited

U.S. PATENT DOCUMENTS 5,812,402 A     9/1998  Nishiyama et al.
6,088,521 A *   7/2000  Strumolo ................ G01M 9/08
                                                    703/8
(Continued)

FOREIGN PATENT DOCUMENTS

JP       9-185647 A     7/1997
JP    2003-48242 A      2/2003
(Continued)

OTHER PUBLICATIONS

Durupt, Alexandre, "From a 3D Point Cloud to an Engineering CAD Model: A Knowledge-Product-Based Approach for Reverse Engineering", "Virtual and Physical Prototyping", Jun. 2008, vol. 3, pp. 51-59. (Year: 2008).*

(Continued)

*Primary Examiner* — Barry Drennan
*Assistant Examiner* — Terrell M Robinson
(74) *Attorney, Agent, or Firm* — Oblon, McClelland, Maier & Neustadt, L.L.P.

(57) ABSTRACT

A computer program product including programmed instructions that cause a computer to perform acquiring, changing, first generating, second generating, and synthesizing. The acquiring includes acquiring first point cloud data including a position on a first three-dimensional surface shape. The changing includes changing, using a three-dimensional element shape, the first three-dimensional surface shape represented by the first point cloud data to a second three-dimensional surface shape. The first generating includes generating second point cloud data including a surface position on the second three-dimensional surface shape. The second generating includes generating, from the (Continued)

second point cloud data, second shape data representing the second three-dimensional shape. The synthesizing includes synthesizing element shape data of the surface model or the solid model and the second shape data to generate first shape data representing the surface model or the solid model of the first three-dimensional shape.

8 Claims, 6 Drawing Sheets

(51) Int. Cl.
  *B33Y 50/00* (2015.01)
  *G06T 1/00* (2006.01)
  *G06T 15/00* (2011.01)
  *G06T 17/10* (2006.01)
  *G06T 19/20* (2011.01)
(52) U.S. Cl.
  CPC ............ *G06T 15/005* (2013.01); *G06T 17/10* (2013.01); *G06T 19/20* (2013.01); *G06T 2210/56* (2013.01); *G06T 2215/06* (2013.01); *G06T 2219/2021* (2013.01)

(56) References Cited

U.S. PATENT DOCUMENTS

| | | | |
|---|---|---|---|
| 6,233,499 B1* | 5/2001 | Matsumoto | B29C 33/3835 700/118 |
| 7,328,080 B2* | 2/2008 | Fu | G05B 19/4099 700/118 |
| 2002/0128744 A1 | 9/2002 | Nishiyama et al. | |
| 2008/0040080 A1* | 2/2008 | Bae | G06F 17/50 703/1 |
| 2013/0083020 A1 | 4/2013 | Shimamura et al. | |
| 2015/0178412 A1* | 6/2015 | Grau | G06F 17/50 703/1 |
| 2018/0029298 A1* | 2/2018 | Takaya | G06F 17/50 |

FOREIGN PATENT DOCUMENTS

| | | | | |
|---|---|---|---|---|
| JP | 2005-215917 A | | 8/2005 | |
| JP | 2007-278995 A | | 10/2007 | |
| JP | 2007278995 | * | 10/2007 | ............ G01B 21/20 |
| JP | 2013-80391 A | | 5/2013 | |

OTHER PUBLICATIONS

International Search Report dated Dec. 15, 2015 in PCT/JP2015/075650 filed Sep. 9, 2015.

* cited by examiner

COMPUTER PROGRAM PRODUCT, INFORMATION PROCESSING APPARATUS, AND DATA PROCESSING METHOD FOR GENERATING 3D SURFACE SHAPES

CROSS-REFERENCE TO RELATED APPLICATIONS

This application is national stage application of International Application No. PCT/JP2015/075650, filed Sep. 9, 2015, which designates the United States, incorporated herein by reference, and which is based upon and claims the benefit of priority from Japanese Patent Application No. 2015-055243, filed Mar. 18, 2015, the entire contents of which are incorporated herein by reference.

FIELD

Embodiments described herein relate generally to a computer program product, an information processing apparatus, and a data processing method.

BACKGROUND

Conventionally, three-dimensional scanners generate point cloud data made of a set of points representing three-dimensional coordinates of a three-dimensional surface shape of a substance. The point cloud data is generally not suitable for three-dimensional processing and is thus often converted into three-dimensional shape data of a surface model or a solid model (three-dimensional CAD model data used in CAD, for example) before use.

However, in the conventional technique, it may be difficult to appropriately convert data of points such as a hole and a dent when generating the three-dimensional shape data from the point cloud data using a free curved surface shape, for example. With a failure in the data conversion, an operator needs to correct the data, which will increase his or her workload.

According to an embodiment, an computer program product including programmed instructions, wherein the instructions cause the computer to perform acquiring, changing, first generating, second generating, and synthesizing. The acquiring includes acquiring first point cloud data including three-dimensional coordinates of a position on a first three-dimensional surface shape. The changing includes changing, using a three-dimensional element shape, the first three-dimensional surface shape represented by the first point cloud data to a second three-dimensional surface shape. The first generating includes generating second point cloud data including three-dimensional coordinates of a surface position on the second three-dimensional surface shape. The second generating includes generating, from the second point cloud data, second shape data representing the second three-dimensional shape by a surface model representing a three-dimensional surface shape by a curved surface or a three-dimensional solid model having a volume. The synthesizing includes synthesizing element shape data of the surface model or the solid model and the second shape data to generate first shape data representing the surface model or the solid model of the first three-dimensional shape.

DETAILED DESCRIPTION

Hereinafter, favorable embodiments of a program, an information processing apparatus, and a data processing method according to this invention will be described in detail with reference to the appended drawings.

First Embodiment

Figure 1:
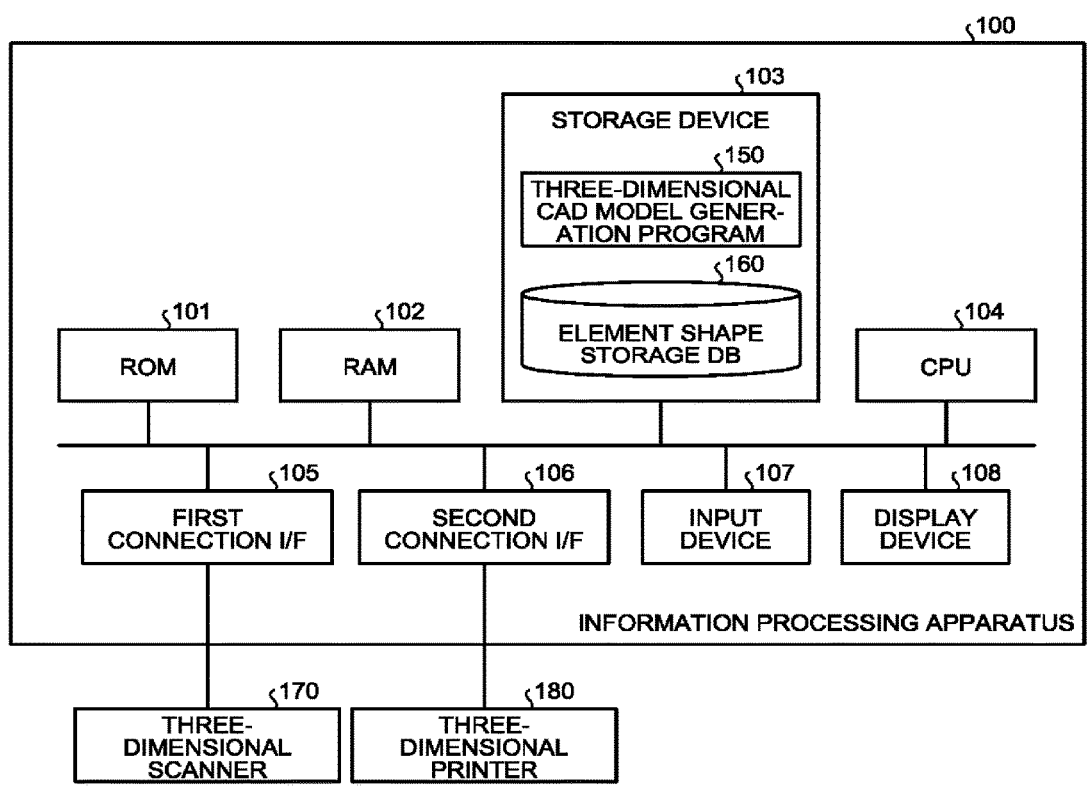
FIG. 1 is a diagram illustrating an exemplary configuration of a three-dimensional object generation system of a first embodiment.

FIG. 1 is a diagram illustrating an exemplary configuration of a three-dimensional object generation system of a first embodiment. As illustrated in FIG. 1, the three-dimensional object generation system includes an information processing apparatus 100, a three-dimensional scanner 170, and a three-dimensional printer 180.

The three-dimensional scanner 170 generates, on the basis of an object to scan, point cloud data representing points on a three-dimensional surface shape of the object as three-dimensional coordinates. The three-dimensional scanner 170 then transmits the generated point cloud data to the information processing apparatus 100.

Any technique may be used to measure the points on the three-dimensional surface shape of the object by the three-dimensional scanner 170 of the present embodiment. For example, there is a technique to irradiate the object with laser light, then detect reflected light with an optical sensor and regard the position reflecting the laser light as the surface of the object, and acquire a set of points representing coordinates of the position as the point cloud data. The optical sensor is provided at one end of an arm as a combination of rotational joints, and is motion-controlled with the arm.

Other examples include a technique using a three-dimensional measuring instrument which includes an optical sensor to contact with the surface of an object for measurement, and a technique using a device including multiple optical sensors which move around and image a target object to measure a distance to the surface of the object.

In the present embodiment, the point cloud data includes positions of points on the surface of the three-dimensional object as coordinates of a three-dimensional coordinate system (for example, an XYZ coordinate system) by way of example. Alternatively, the point cloud data can be polygon data including positions of vertices of a polygon triangle as three-dimensional coordinates.

The three-dimensional printer 180 is a device that generates an object having a three-dimensional shape by adhesion of material according to three-dimensional CAD model data.

The three-dimensional printer 180 of the present embodiment may form objects by an arbitrary method, for example, extrusion deposition, material injection deposition, binder injection, sheet deposition, liquid tank photopolymerization, or powder bed fusion.

The three-dimensional CAD model data in the present embodiment is three-dimensional shape data usable in a three-dimensional printer or a three-dimensional CAD, and represents a three-dimensional object by a surface model representing a three-dimensional surface shape of a substance by a free curved surface or a solid model representing a three-dimensional shape as a three-dimensional solid having a volume.

As illustrated in FIG. 1, the information processing apparatus 100 includes a ROM 101, a RAM 102, a storage device 103, a CPU 104, a first connection I/F 105, a second connection I/F 106, an input device 107, and a display device 108.

For example, the information processing apparatus 100 can execute various types of processing by the CPU 104's executing an OS and programs stored in the ROM 101 or the storage device 103, using the RAM 102 as a work area.

The first connection I/F 105 and the second connection I/F 106 can be USB standard interfaces including a built-in universal serial bus (USB) controller, for example. In the present embodiment the first connection I/F 105 is connected to the three-dimensional scanner 170, and the second connection I/F 106 is connected to the three-dimensional printer 180.

The information processing apparatus 100 of the present embodiment executes a three-dimensional CAD model generation program 150 stored in the storage device 103. The three-dimensional CAD model generation program 150 converts the point cloud data, input from the three-dimensional scanner 170 through the first connection I/F 105, into the three-dimensional CAD model data. The three-dimensional CAD model generation program 150 refers to an element shape storage DB 160 for the data conversion into the three-dimensional CAD model data.

The three-dimensional CAD model generation program 150 outputs the converted three-dimensional CAD model data to the three-dimensional printer 180 through the second connection I/F 106. Thereby, the three-dimensionally shaped substance scanned with the three-dimensional scanner 170 can be output.

The present embodiment describes as an example, but should not be limited to, an application of the three-dimensional CAD model generation program 150 as a single program. Alternatively, the three-dimensional CAD model generation program 150 may be an add-in program to a three-dimensional CAD plug, for example.

The input device 107 receives an operation from an operator, and provides the three-dimensional CAD model generation program 150 an instruction for executing processing.

The display device 108 displays various types of information. For example, the display device 108 displays read point cloud data and a three-dimensional shape based on three-dimensional CAD model data.

Figure 2:
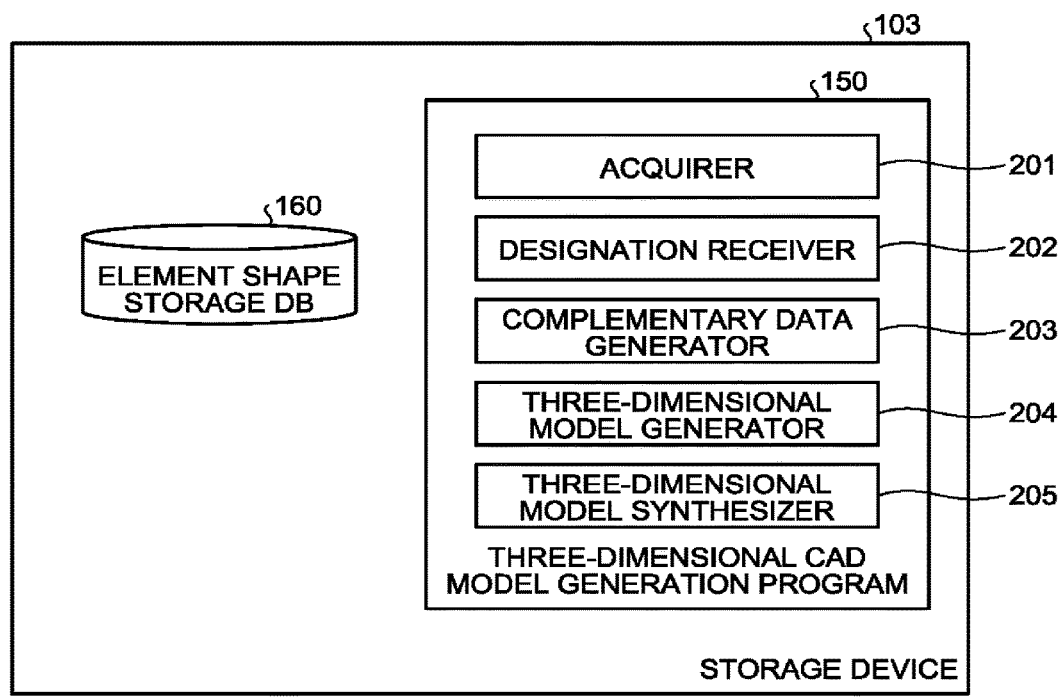
FIG. 2 is a block diagram illustrating an exemplary configuration of a storage device in the first embodiment.

FIG. 2 is a block diagram illustrating an exemplary configuration of the storage device 103 in the present embodiment. As illustrated in FIG. 2, the three-dimensional CAD model generation program 150 includes an acquirer 201, a designation receiver 202, a complementary data generator 203, a three-dimensional model generator 204, and a three-dimensional model synthesizer 205. Then, the CPU 104 reads the three-dimensional CAD model generation program 150 from the storage device 103, to cause the elements illustrated in FIG. 2 to perform processing. The storage device 103 stores the element shape storage database 160 for use by the three-dimensional CAD model generation program 150.

The three-dimensional CAD model generation program 150 of the present embodiment converts the point cloud data scanned by the three-dimensional scanner 170 into the three-dimensional CAD model data readable by the three-dimensional printer 180.

Figure 3:
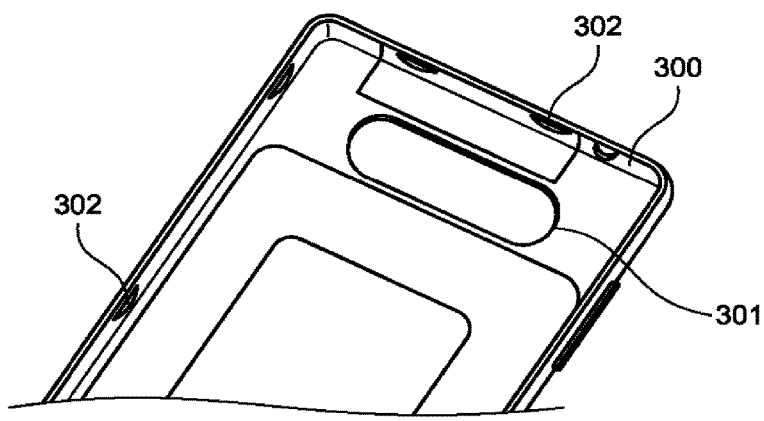
FIG. 3 illustrates an exemplary three-dimensional shape represented by point cloud data in the first embodiment.

FIG. 3 illustrates an exemplary three-dimensional shape represented by the point cloud data of the present embodiment. As illustrated in FIG. 3, a three-dimensional shape 300 includes different element shapes.

The three-dimensional shape 300 includes locally changing element shapes as a long hole 301 and dents 302 (in the present embodiment, a three-dimensional shape as an element of a three-dimensional shape represented by point cloud data, or a three-dimensional shape serving as an element that complements a part of the three-dimensional shape represented by the point cloud data is referred to as element shape). Converting the point cloud data of the three-dimensional shape 300 including these element shapes into the three-dimensional CAD model data results in surface deformation or a missing curved surface due to an influence of the element shapes. That may even make it impossible to create a surface. This occurs because the element shapes are difficult to maintain continuity of a free curved surface or a solid.

In such a situation, conventionally, the operator corrects a three-dimensional CAD model with a three-dimensional CAD, for example. This likely creates a workload of the operator and requires work time therefor.

Thus, the three-dimensional CAD model generation program 150 of the present embodiment is configured to remove a locally changing element shape from the three-dimensional shape before data conversion. The three-dimensional CAD model generation program 150 then converts each of the point cloud data of the three-dimensional shape excluding the element shape and the point cloud data of the element shape into three-dimensional CAD model data. The three-dimensional CAD model generation program 150 then synthesizes the generated three-dimensional CAD model data to generate the three-dimensional CAD model data of the original three-dimensional shape.

In the present embodiment, the three-dimensional shape excluding the element shape and the element shape are processed as different sets of point cloud data. This makes it easier to maintain the continuity of a free curved surface or a solid to be able to generate accurate three-dimensional CAD model data.

The three-dimensional CAD model data in the present embodiment is data readable by a three-dimensional CAD application or the three-dimensional printer, and holds the three-dimensional shape by the surface model or the solid model. The surface model is defined as a three-dimensional shape model as a group of free curved surfaces representing a three-dimensional surface shape. The solid model is defined as a three-dimensional shape model representing a solid with volume information in the three-dimensional coordinate system. Next, the configuration of the three-dimensional CAD model generation program 150 will be described.

Referring back to FIG. 2, the acquirer 201 acquires the point cloud data from which the three-dimensional CAD model data is to be generated. The acquirer 201 of the present embodiment acquires the point cloud data from the three-dimensional scanner 170. However, the source of the point cloud data is not limited to the three-dimensional scanner 170, and the point cloud data may be acquired from an information processing apparatus connected through a public network, for instance.

The designation receiver 202 receives, through the input device 107, a designation of the element shape to remove from the three-dimensional shape represented by the point cloud data acquired by the acquirer 201. Further, the designation receiver 202 receives a designation of an additional element shape to the three-dimensional shape.

In the example illustrated in FIG. 3, the designation receiver 202 receives a designation of additional element shapes to the three-dimensional shape, that is, selecting and filling the long hole 301 and the dents 302, for example.

In the present embodiment, upon receiving the designation of the element shape, the designation receiver 202 stores in the RAM 102 the point cloud data representing the element shapes and position information indicating the positions of the element shapes in the three-dimensional shape. The positions of the element shapes indicated by the position information are used to synthesize the three-dimensional CAD model data sets.

The designation receiver 202 stores the point cloud data representing the element shapes in the element shape storage database 160. Thereby, upon acquisition of point cloud data by the acquirer 201, when the element shape storage database 160 stores point cloud data of an element shape approximating a part of a three-dimensional shape of the acquired point cloud data, the designation receiver 202 displays the approximate element shape on the display device 108.

The designation receiver 202 then displays, on the display device 108, a message screen asking the operator about whether to designate the element shape. When receiving the designation of the element shape, the designation receiver 202 then uses the element shape (the point cloud data thereof stored in the element shape storage database 160) to complement the three-dimensional shape of the point cloud data acquired by the acquirer 201.

The complementary data generator 203 generates complementary point cloud data representing the three-dimensional surface shape based on the point cloud data acquired by the acquirer 201 and modified with the element shape. The element shape may be specified by the designation receiver 202 or may be the element shape stored as the point cloud data in the element shape storage database 160.

In the present embodiment, the element shapes are intended for complementing holes, projections, or recesses in the three-dimensional surface shape represented by the point cloud data acquired by the acquirer 201. The element shapes can include, for example, an element shape to fill a hole or a recess in the surface of the three-dimensional shape or an element shape that eliminates a projection on the surface.

In a case where the element shape designated by the designation receiver 202 is not yet registered in the element shape storage database 160, the complementary data generator 203 generates point cloud data representing the designated element shape. The generated point cloud data is stored in the element shape storage database 160.

The element shape storage database 160 stores point cloud data representing element shapes. The element shape storage database 160 may pre-store point cloud data of element shapes in addition to the point cloud data of the element shape designated by the designation receiver 202.

Further, the element shape storage database 160 may contain point cloud data of element shapes corrected in shape.

The three-dimensional model generator 204 generates complementary three-dimensional CAD model data from the complementary point cloud data. The complementary three-dimensional CAD model data is defined as three-dimensional CAD model data representing the three-dimensional shape complemented with the element shape.

Further, the three-dimensional model generator 204 generates three-dimensional element CAD model data of the element shape from the point cloud data representing the element shape.

The three-dimensional model synthesizer 205 generates the three-dimensional CAD model data representing the three-dimensional surface model or solid model represented by the point cloud data acquired by the acquirer 201, on the basis of the complementary three-dimensional CAD model data and the three-dimensional element CAD model data.

For example, when the three-dimensional element CAD model data represents the element shape to fill a three-dimensional hole, the three-dimensional model synthesizer 205 generates the three-dimensional CAD model data of the three-dimensional shape with the hole, by removing the element shape represented by the three-dimensional element CAD model data from the three-dimensional shape represented by the complementary three-dimensional CAD model data. The position of the three-dimensional shape from which the element shape is removed is the position of the element shape stored in the RAM 102 by the designation receiver 202.

As another example, when the three-dimensional element CAD model data represents the element shape of a projection removed from the three-dimensional shape, the three-dimensional model synthesizer 205 generates the three-dimensional CAD model data of the three-dimensional shape with the projection, by adding the element shape represented by the three-dimensional element CAD model data to the three-dimensional shape represented by the complementary three-dimensional CAD model data.

Figure 4:
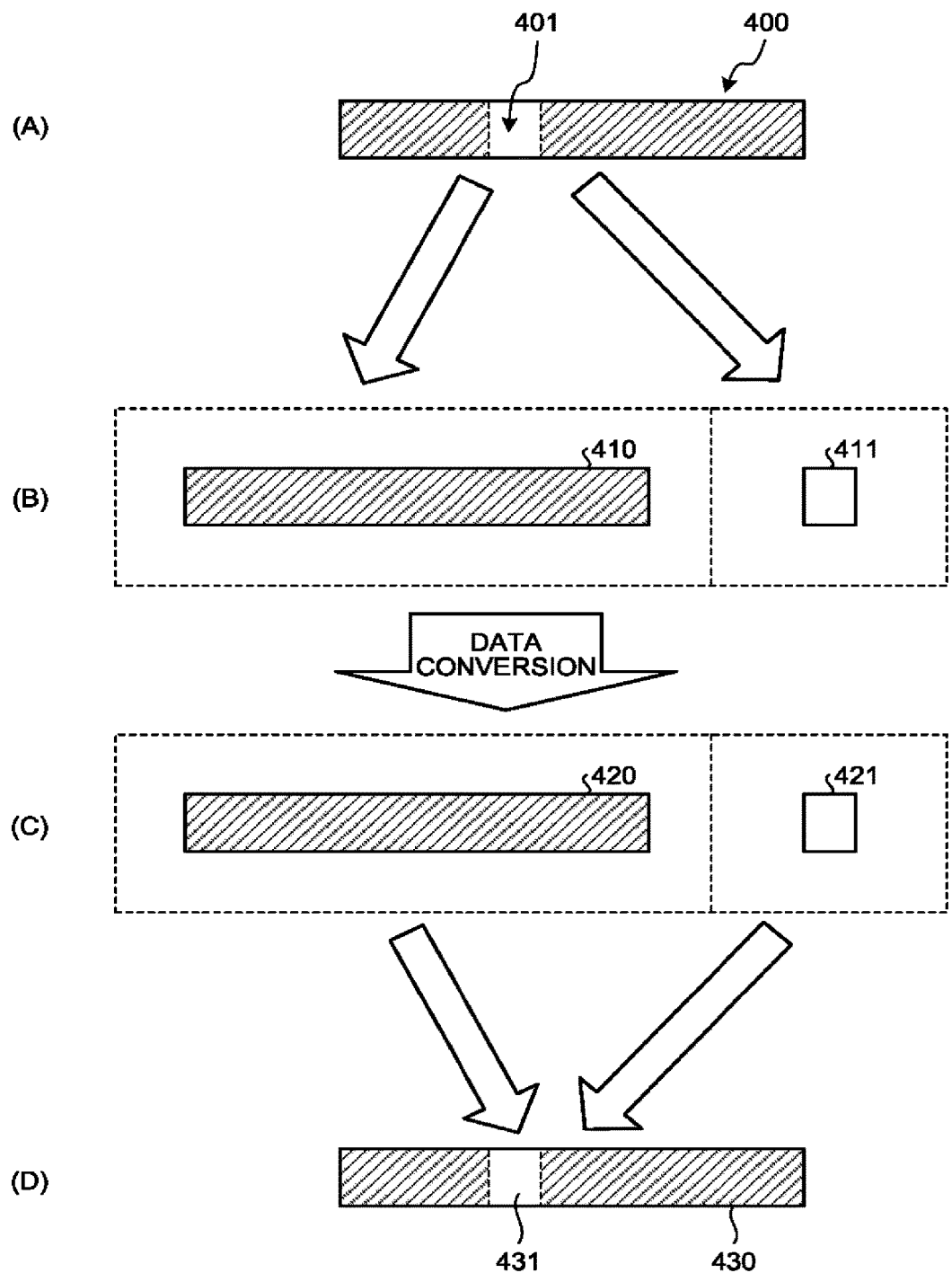
FIG. 4 illustrates an exemplary concept of processing by a three-dimensional CAD model generation program of the first embodiment.

FIG. 4 is diagrams illustrating an exemplary concept of processing by the three-dimensional CAD model generation program 150 of the present embodiment. (A) in FIG. 4 is point cloud data representing a three-dimensional shape 400 with a hole 401, acquired by the acquirer 201. Through data conversion of such point cloud data into the three-dimensional CAD model data, the peripheral shape of the hole 401 may not be appropriately converted.

In view of this, as illustrated in (B) in FIG. 4, the complementary data generator 203 generates complementary point cloud data of a three-dimensional shape 410 with the hole 401 filled. The complementary data generator 203 also generates point cloud data representing a three-dimensional shape 411 of the hole 401.

Then, as illustrated in (C) of FIG. 4, the three-dimensional model generator 204 converts the complementary point cloud data to generate complementary three-dimensional CAD model data representing a three-dimensional shape 420 with the filled hole 401. Further, the three-dimensional model generator 204 converts the point cloud data to generate three-dimensional element CAD model data representing a three-dimensional shape 421 of the hole 401.

Then, as illustrated in (D) of FIG. 4, the three-dimensional model synthesizer 205 provides a three-dimensional shape 430 represented by the complementary three-dimensional CAD model data with a hole 431 represented by the three-dimensional element CAD model data to generate the three-dimensional CAD model data.

The present embodiment can prevent a missing surface or a surface distortion by separating sharply changing points on the surface of three-dimensional shape from the point cloud data as the element shape and converting the point cloud data into the three-dimensional CAD model data. Next, a specific three-dimensional shape will be described.

Figure 5:
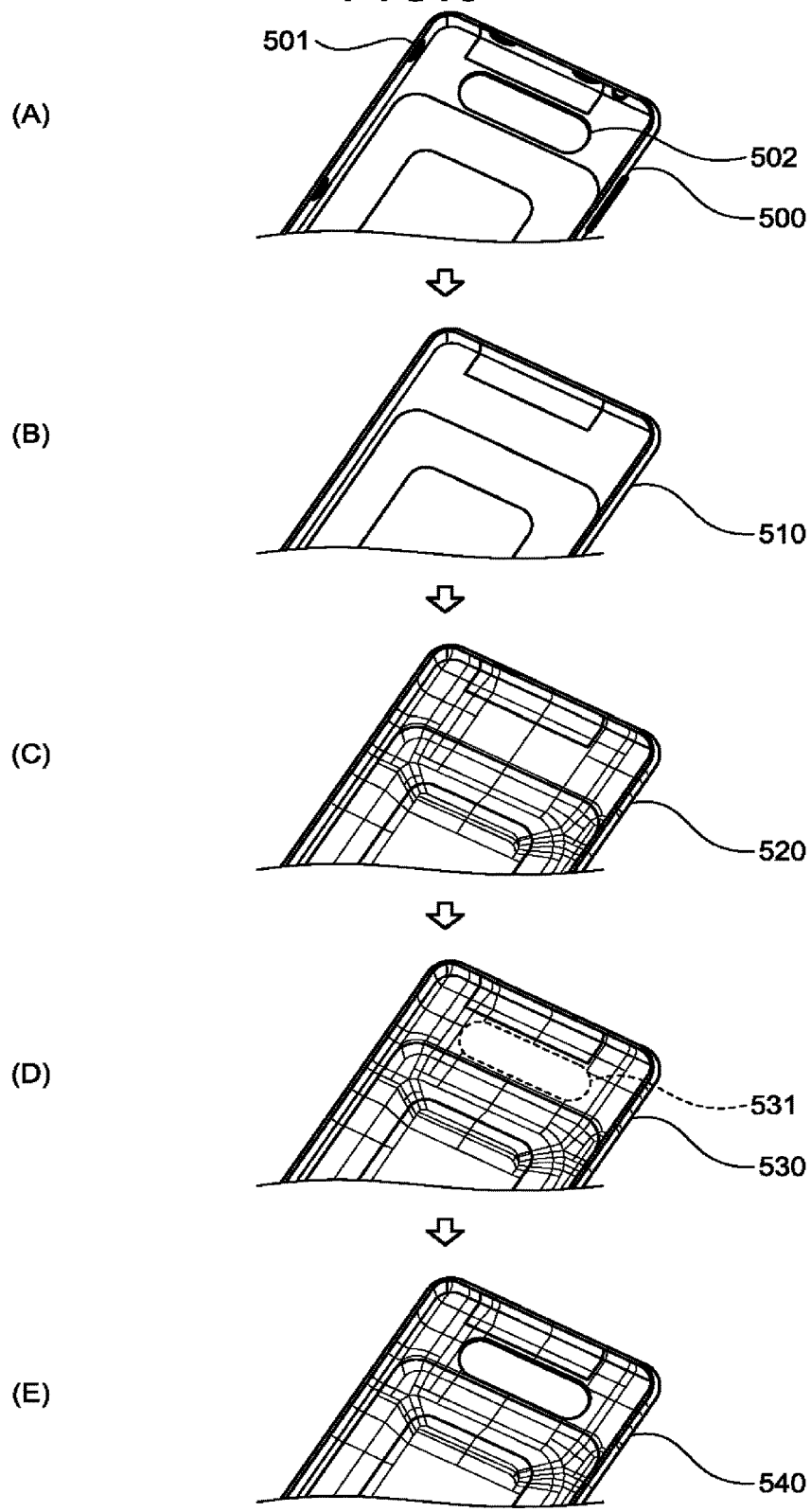
FIG. 5 illustrates an exemplary transition of a three-dimensional shape based on the processing by the three-dimensional CAD model generation program of the first embodiment.

FIG. 5 is diagrams illustrating an exemplary transition of the three-dimensional shape by the processing according to the three-dimensional CAD model generation program 150 of the present embodiment.

(A) of FIG. 5 exemplifies the three-dimensional shape represented by the point cloud data acquired by the acquirer 201. A three-dimensional shape 500 illustrated in (A) of FIG. 5 includes a long hole 502 and dents 501. Through data conversion of the point cloud data containing the long hole 502 and the dents 501 into the three-dimensional CAD model data, a contour of the long hole 502 may lack a curved surface or a curved surface around the dents 501 may be deformed.

In view of this, as illustrated in (B) of FIG. 5, the complementary data generator 203 sets the element shapes having the same shapes as the long hole 502 and the dents 501 to a three-dimensional shape 510 to complement them. The complementary data generator 203 stores the positions of the element shapes set in the three-dimensional shape 510 in the element shape storage database 160 in addition to the point cloud data representing the three-dimensional shapes of the element shapes.

Then, as illustrated in (C) of FIG. 5, the three-dimensional model generator 204 converts the complementary point cloud data representing a three-dimensional shape 510 complemented by the complementary data generator 203 to generate complementary three-dimensional CAD model data 520. The three-dimensional model generator 204 converts the point cloud data of the element shapes having the same shapes as the long hole 502 and the dents 501 to generate the three-dimensional element CAD model data. Through such data conversion, a missing curved surface or a deformed curved surface does not occur because of no presence of sharply changing points on the surface such as the long hole 502 and the dents 501 as illustrated in (A) of FIG. 5.

Then, as illustrated in (D) of FIG. 5, the three-dimensional model synthesizer 205 sets the element shapes (long hole 531 and dents, for example) represented by the three-dimensional element CAD model data to a three-dimensional shape 530 represented by the complementary three-dimensional CAD model data. The element shapes are set at the positions corresponding to the positions stored in (B) of FIG. 5. By automatically setting the element shapes, the workload of the operator can be reduced.

Thereby, the three-dimensional CAD model data representing a three-dimensional shape 540 of the point cloud data acquired by the acquirer 201, as illustrated in (E) of FIG. 5, can be generated. As described above, by separately converting the point cloud data sets into the three-dimensional CAD model data before synthesis, the three-dimensional CAD model data of the three-dimensional shape without a missing curved surface or a deformed curved surface can be generated.

Figure 6:
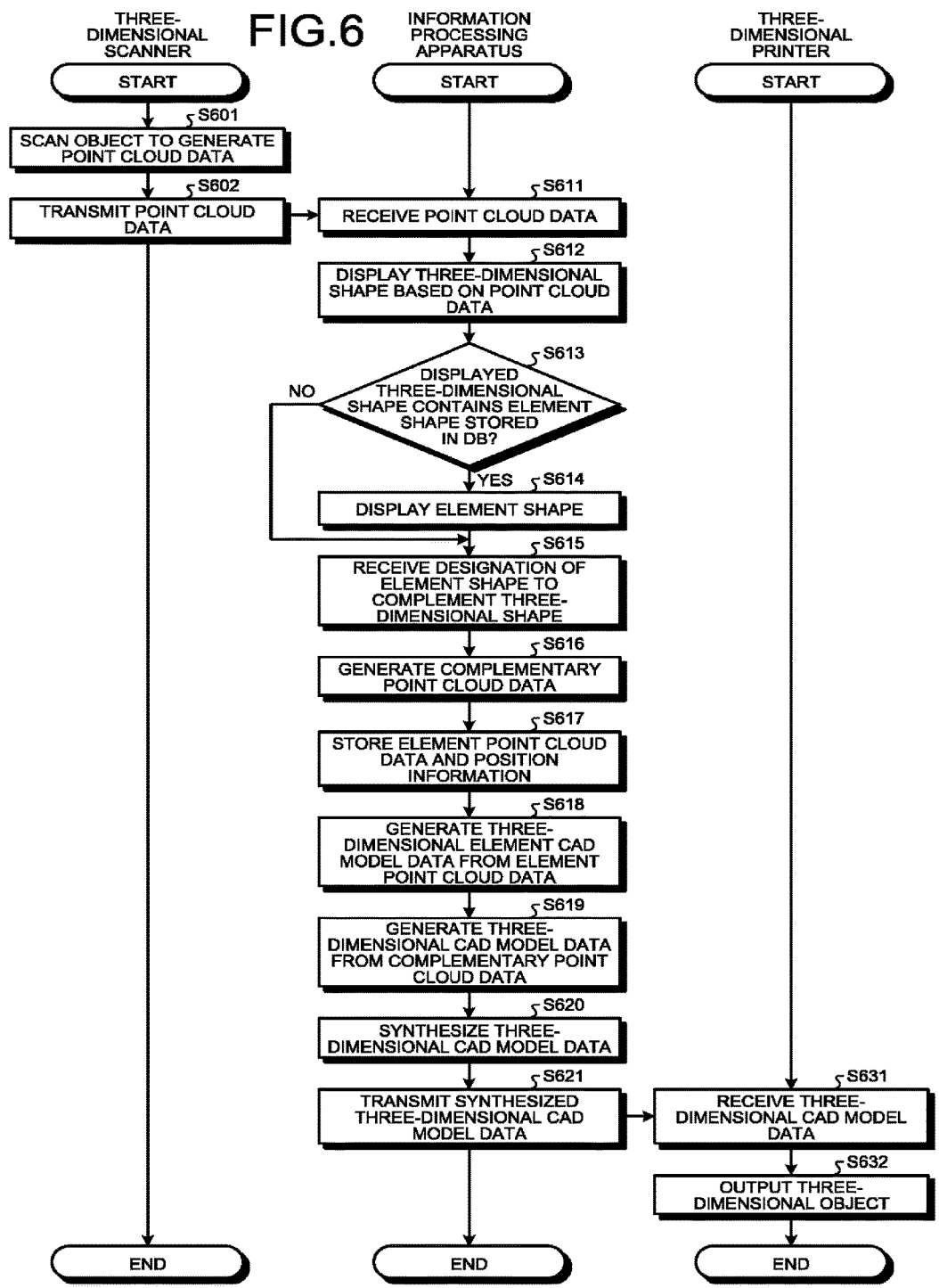
FIG. 6 is a flowchart of the overall procedure of a three-dimensional object generation system of the first embodiment.

Next, the overall processing of the three-dimensional object generation system of the present embodiment will be described. FIG. 6 is a flowchart of the procedure of the three-dimensional object generation system of the present embodiment.

First, the three-dimensional scanner 170 scans an object to generate point cloud data representing the positions on the surface of the object by three-dimensional coordinates (S601).

The three-dimensional scanner 170 then transmits the generated point cloud data to the information processing apparatus 100 (S602).

The acquirer 201 of the information processing apparatus 100 acquires the point cloud data from the three-dimensional scanner 170 through the first connection I/F 105 (S611).

Next, the three-dimensional CAD model generation program 150 of the information processing apparatus 100 displays the three-dimensional shape based on the acquired point cloud data on the display device 108 (S612).

The designation receiver 202 then determines whether the displayed three-dimensional shape contains the element shape stored in the element shape storage DB 160 (S613). When determining absence of the element shape (S613: No), the designation receiver 202 proceeds to S615.

On the other hand, when determining that the displayed three-dimensional shape contains the element shape stored in the element shape storage DB 160 (S613: Yes), the designation receiver 202 allows the element shape to be displayed (S614). Thereby, the operator can designate the displayed element shape as the one to complement the three-dimensional shape.

Next, the designation receiver 202 receives a designation of the element shape from the displayed three-dimensional shape to complement the three-dimensional shape (S615). The element shape may be designated in the same or similar manner as in the three-dimensional CAD, for example.

The complementary data generator 203 generates complementary point cloud data representing the three-dimensional shape complemented with the element shape designated in one or both of S614 and S615 (S616). Further, the complementary data generator 203 generates element point cloud data representing the designated element shape, as needed.

The complementary data generator 203 stores, in the RAM 102, the generated element point cloud data and position information on the original three-dimensional element shape represented by the element point cloud data (S617). Further, the complementary data generator 203 stores the generated element point cloud data in the element shape storage DB 160, as needed.

The three-dimensional model generator 204 converts the element point cloud data representing the element shape into the three-dimensional element CAD model data representing the element shape (S618).

The three-dimensional model generator 204 converts the complementary point cloud data representing the three-dimensional shape complemented with the element shape to generate the complementary three-dimensional CAD model data representing the three-dimensional shape complemented with the element shape (S619).

The three-dimensional model synthesizer 205 synthesizes the three-dimensional CAD model data (S620). The three-dimensional model synthesizer 205 of the present embodiment generates the three-dimensional CAD model data representing the three-dimensional shape, by placing the element shape represented by the three-dimensional element CAD model data on the three-dimensional shape represented by the complementary three-dimensional CAD model data at the positions indicated by the position information stored in S617.

The three-dimensional CAD model generation program 150 then transmits the three-dimensional CAD model data synthesized in S620 to the three-dimensional printer 180 (S621).

The three-dimensional printer 180 receives the three-dimensional CAD model data from the information processing apparatus 100 (S631).

The three-dimensional printer 180 outputs a three-dimensional object based on the received three-dimensional CAD model data (S632).

The three-dimensional object generation system of the present embodiment can output accurate three-dimensional objects by the above-described procedure with a reduction in the workload of the operator to correct a missing or deformed curved surface of the three-dimensional CAD model.

In the three-dimensional object generation system of the present embodiment, the element shape storage database 160 stores the point cloud data representing the element shapes, by way of example. However, the present embodiment is not intended for limiting the element shapes to store to the point cloud data. As a modification, the element shape storage DB 160 may store the point cloud data representing the element shapes and the three-dimensional CAD model data (three-dimensional element CAD model data) representing the element shapes in association with each other. In such a modification, the complementary three-dimensional CAD model data representing the three-dimensional shape complemented with the element shape is generated by the same procedure as that in the first embodiment. After that, the three-dimensional model synthesizer 205 of the modification synthesizes the complementary three-dimensional CAD model data and the three-dimensional element CAD model data stored in advance. Thereby, the modification can attain a similar effect to that of the first embodiment.

Second Embodiment

The first embodiment has described one example of the information processing apparatus 100 in which the point cloud data generated by the three-dimensional scanner 170 is converted into the three-dimensional CAD model data readable by the three-dimensional printer 180. However, the example is not intended for limiting the configuration performing data conversion to the information processing apparatus. A second embodiment will describe the example that a three-dimensional scanner performs data conversion.

Figure 7:
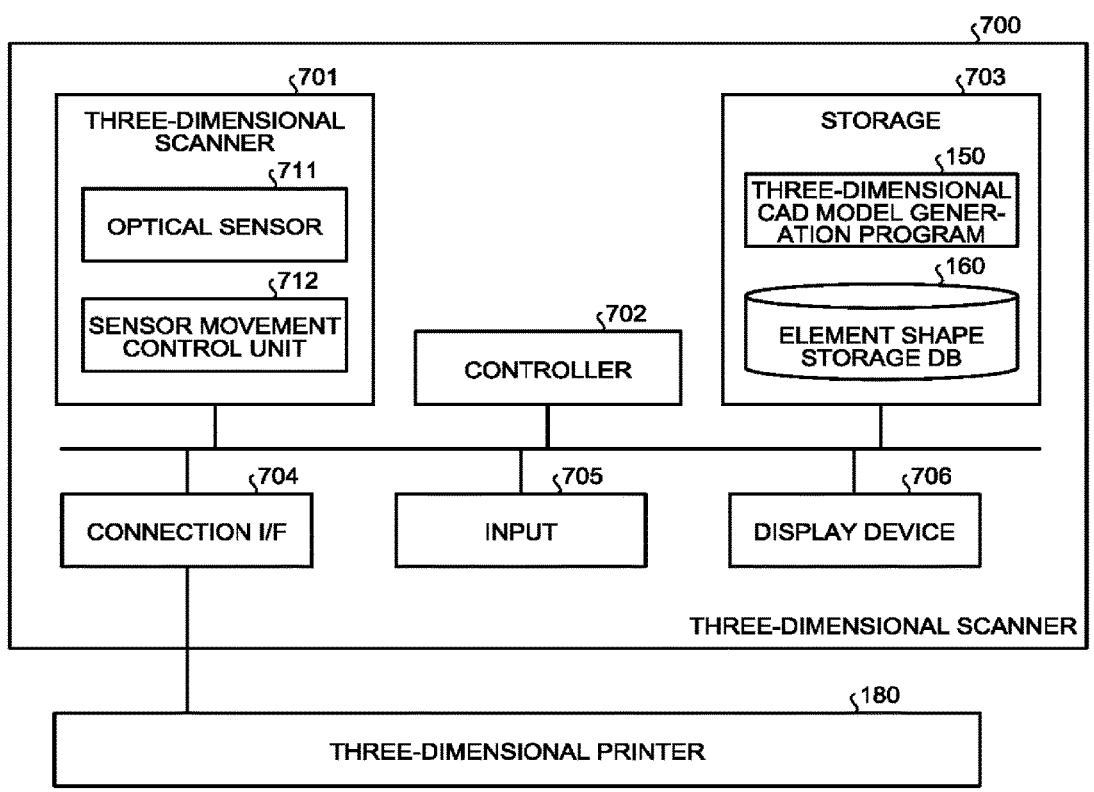
FIG. 7 is a diagram illustrating exemplary configurations of a three-dimensional scanner and a three-dimensional printer of a second embodiment.

FIG. 7 is a diagram illustrating exemplary configurations of a three-dimensional scanner and a three-dimensional printer of a second embodiment. As illustrated in FIG. 7, a three-dimensional scanner 700 and a three-dimensional printer 180 are connected.

The three-dimensional scanner 700 includes a three-dimensional scanner 701, a controller 702, a storage 703, a connection I/F 704, an input 705, and a display device 706. Same or like elements as those in the first embodiment are denoted by the same or like reference numerals, and a description thereof is omitted.

The three-dimensional scanner 701 includes an optical sensor 711 and a sensor motion controller 712, and reads a three-dimensional shape of an object to generate point cloud data. For example, for generation of the point cloud data, the optical sensor 711 is motion-controlled by the sensor motion controller 712 to detect positions on the three-dimensional surface of the object.

The storage 703 stores a three-dimensional CAD model generation program 150 and an element shape storage database 160.

The controller 702 includes a CPU, a ROM, and a RAM (not illustrated), and executes the three-dimensional CAD model generation program 150 stored in the storage 703 to implement a configuration similar to that in FIG. 2 of the first embodiment.

The three-dimensional CAD model generation program 150 generates three-dimensional CAD model data from the point cloud data generated by the three-dimensional scanner 701. The procedure of generating the three-dimensional CAD model data by the three-dimensional CAD model generation program 150 is similar to the procedure of the first embodiment, and thus a description thereof is omitted. As with the first embodiment, the display device 706 displays the three-dimensional shape and the input 705 receives a designation of an element shape.

The three-dimensional scanner 700 transmits the generated three-dimensional CAD model data to the three-dimensional printer.

The three-dimensional scanner 700 of the present embodiment has the above-described configuration, thereby implementing the processing similar to that of the information processing apparatus 100 of the first embodiment and attaining a similar effect to that of the first embodiment.

Third Embodiment

The second embodiment has described the example of converting the point cloud data into the three-dimensional CAD model by the three-dimensional scanner 700. A third embodiment will describe an example of data conversion by a three-dimensional printer.

In the present embodiment, a three-dimensional scanner and a three-dimensional printer are connected. The three-dimensional scanner generates point cloud data and transmits the generated point cloud data to the three-dimensional printer.

The three-dimensional printer includes a controller 702, a storage 703, an input 705, and a display device 706, as with the three-dimensional scanner 700 of the second embodiment. In addition, the three-dimensional printer includes a three-dimensional output. Same or like elements as those of the second embodiment are denoted by the same or like reference numerals, and a description thereof is omitted.

With the configuration, the controller 702 of the three-dimensional printer generates three-dimensional CAD data from the point cloud data received from the three-dimensional scanner according to an executed three-dimensional CAD model generation program 150.

Then, the three-dimensional output forms an object having a three-dimensional shape of three-dimensional CAD model data on the basis of the three-dimensional CAD data generated by the three-dimensional CAD model generation program 150.

The three-dimensional printer of the present embodiment has the above-described configuration, thereby implementing the processing similar to that of the information processing apparatus 100 of the first embodiment and attaining a similar effect to that of the first embodiment.

The above-described embodiments have described the example in which the operator designates the element shape that complements the three-dimensional shape of the point cloud data. However, the designation of the element shape is not limited to the manual operation by the operator. Alternatively, the three-dimensional CAD model generation program 150 may be configured to control the respective elements to identify a location on a three-dimensional shape where a deformed curved surface or a missing curved surface likely occurs, on the basis of a threshold, and designate the element shape in the identified location.

In the above-described embodiments, in generating the three-dimensional CAD model data from the point cloud data, the element shape is converted into separate point cloud data sets, and the point cloud data sets are converted into separate three-dimensional CAD model data sets for synthesizing. This can prevent occurrence of a deformed curved surface and a missing curved surface, which would otherwise occur at the time of data conversion. This can reduce a workload of the operator to correct the curved surface accordingly, leading to generating accurate three-dimensional CAD model data.

The three-dimensional CAD model generation program 150 executed in the information processing apparatus 100 of the present embodiment may be recorded and provided on a computer-readable recording medium such as a CD-ROM, a flexible disk (FD), a CD-R, or a digital versatile disk (DVD) in an installable format or an executable file format.

Further, the three-dimensional CAD model generation program 150 executed in the information processing apparatus 100 of the present embodiment may be configured to be stored on a computer connected with a network such as the Internet and downloaded through the network. The three-dimensional CAD model generation program 150 executed in the information processing apparatus 100 of the present embodiment may be provided or distributed through the network such as the Internet.

Further, the three-dimensional CAD model generation program 150 of the present embodiment may be incorporated in advance in a ROM or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A computer program product including programmed instructions embodied in and stored on a non-transitory computer readable medium, wherein the instructions, when executed by a computer, cause the computer to perform:
   acquiring first point cloud data including three-dimensional coordinates of a position on a first three-dimensional surface shape;
   changing, using a three-dimensional element shape that complements a hole, a projection, or a recess in the first three-dimensional surface shape, the first three-dimensional surface shape represented by the first point cloud data to a second three-dimensional surface shape, and first generating second point cloud data including three-dimensional coordinates of a surface position on the second three-dimensional surface shape with the hole, the projection, or the recess complemented;
   second generating second shape data from the second point cloud data, the second shape data representing the second three-dimensional surface shape by a surface model or a solid model, the surface model representing a three-dimensional surface shape by a curved surface, the solid model representing a three-dimensional shape having a volume as solid information; and
   synthesizing the second shape data and element shape data representing the element shape by the surface model or the solid model, to generate first shape data representing the surface model or the solid model of the first three-dimensional surface shape.

2. The computer program product according to claim 1, wherein the second generating includes generating the element shape data from third point cloud data representing the element shape, using the surface model or the solid model.

3. The computer program product according to claim 1, wherein
   the computer includes a storage that stores third point cloud data representing the three-dimensional element shape that complements a hole, a projection, or a recess, and
   the changing includes changing the first three-dimensional surface shape represented by the first point cloud data, using the element shape represented by the third point cloud data stored in the storage, to generate the second point cloud data.

4. The computer program product according to claim 1 wherein the instructions cause the computer to further perform:
   receiving a designation of the element shape, and
   the changing includes changing the first three-dimensional surface shape to the second three-dimensional surface shape, using the element shape designated in the receiving, and the first generating includes generating second point cloud data including coordinates of a position on the second three-dimensional surface shape.

5. An information processing apparatus comprising:
   a processor configured to:
   acquire first point cloud data including three-dimensional coordinates of a position on a first three-dimensional surface shape;
   change, using a three-dimensional element shape that complements a hole, a projection, or a recess in the first three-dimensional surface shape, the first three-dimensional surface shape represented by the first point cloud data to a second three-dimensional surface shape, and generate second point cloud data including three-dimensional coordinates of a position on the second three-dimensional surface shape with the hole, the projection, or the recess complemented;
   generate second shape data from the second point cloud data, the second shape data representing the second three-dimensional surface shape by a surface model or a solid model, the surface model representing a three-dimensional surface shape by a curved surface, the solid model representing a three-dimensional shape having a volume as solid information; and
   synthesize the second shape data and element shape data representing the element shape by the surface model or the solid model, to generate first shape data representing the surface model or the solid model of the first three-dimensional surface shape.

6. The information processing apparatus according to claim 5, further comprising:
   a three-dimensional scanner configured to read the first three-dimensional surface shape of an object to generate the first point cloud data,
   wherein the processor acquires the first point cloud data generated by the three-dimensional scanner.

7. The information processing apparatus according to claim 5, further comprising:
a three-dimensional output configured to form, using a three-dimensional printer, the object representing the first three-dimensional surface shape, based on the first shape data generated by the processor.

8. A data processing method to be executed by an information processing apparatus, the data processing method comprising:
acquiring first point cloud data including three-dimensional coordinates of a position on a first three-dimensional surface shape;
changing the first three-dimensional surface shape represented by the first point cloud data to a second three-dimensional surface shape, using a three-dimensional element shape that complements a hole, a projection, or a recess in the first three-dimensional surface shape, and generating second point cloud data including three-dimensional coordinates of a position on the second three-dimensional surface shape with the hole, the projection, or the recess complemented;
generating second shape data from the second point cloud data, the second shape data representing the second three-dimensional surface shape by a surface model or a solid model, the surface model representing a three-dimensional surface shape by a curved surface, the solid model representing a three-dimensional shape having a volume as solid information; and
synthesizing the second shape data and element shape data representing the element shape by the surface model or the solid model, to generate first shape data representing the surface model or the solid model of the first three-dimensional surface shape.

* * * * *